(12) United States Patent
Kauffman et al.

(10) Patent No.: US 10,205,465 B2
(45) Date of Patent: Feb. 12, 2019

(54) APPARATUS FOR OVERLOAD RECOVERY OF AN INTEGRATOR IN A SIGMA-DELTA MODULATOR

(71) Applicant: INTEL IP CORPORATION, Santa Clara, CA (US)

(72) Inventors: John G. Kauffman, Munich (DE); Krzysztof Dufrene, Plesching (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/494,408

(22) Filed: Apr. 21, 2017

(65) Prior Publication Data

US 2017/0288692 A1  Oct. 5, 2017

Related U.S. Application Data

(63) Continuation of application No. 14/751,063, filed on Jun. 25, 2015, now Pat. No. 9,680,496.

(51) Int. Cl.
| | |
|---|---|
| *H03M 1/06* | (2006.01) |
| *H03M 3/00* | (2006.01) |
| *H03M 1/46* | (2006.01) |
| *H03M 1/12* | (2006.01) |
| *H03M 1/00* | (2006.01) |

(52) U.S. Cl.
CPC ......... *H03M 3/356* (2013.01); *H03M 1/0607* (2013.01); *H03M 1/46* (2013.01); *H03M 3/444* (2013.01); *H03M 3/464* (2013.01); *H03M 1/00* (2013.01); *H03M 1/12* (2013.01); *H03M 3/30* (2013.01); *H03M 3/386* (2013.01); *H03M 3/424* (2013.01); *H03M 3/454* (2013.01)

(58) Field of Classification Search
CPC ............ H03M 1/00; H03M 1/12; H03M 3/30
USPC ......................... 341/118, 120, 155, 156, 143
See application file for complete search history.

(56) References Cited

U.S. PATENT DOCUMENTS

| | | | |
|---|---|---|---|
| 4,630,102 A | 12/1986 | Wargo | |
| 5,612,698 A * | 3/1997 | Reay | H03M 1/181 |
| | | | 341/155 |
| 5,742,246 A | 4/1998 | Kuo | |
| 6,453,181 B1 | 9/2002 | Challa | |
| 8,884,629 B1 | 11/2014 | Kumar | |
| 9,543,978 B2 * | 1/2017 | Mattisson | H03M 3/344 |
| 2009/0278719 A1 | 11/2009 | Braswell | |
| 2011/0200161 A1 | 8/2011 | Tasic | |
| 2012/0200437 A1 * | 8/2012 | Moue | H03M 3/386 |
| | | | 341/110 |

OTHER PUBLICATIONS

Non Final Office Action for U.S. Appl. No. 14/751,063, dated Jan. 21, 2016.

(Continued)

*Primary Examiner* — Joseph Lauture
(74) *Attorney, Agent, or Firm* — Green, Howard & Mughal LLP

(57) ABSTRACT

Described is an apparatus which comprises: a first integrator to receive an input signal and to generate a first output; a second integrator to receive the first output or a version of the first output and to generate a second output; and an analog-to-digital converter (ADC) to quantize the second output into a digital representation, the ADC including a detection circuit to detect an overload condition in the second output.

33 Claims, 7 Drawing Sheets

(56) References Cited

OTHER PUBLICATIONS

Non Final Office Action for U.S. Appl. No. 14/751,063, dated Jun. 23, 2016.
Notice of Allowance for U.S. Appl. No. 14/751,063, dated Feb. 13, 2017.
Mitteregger, G. et al., "A 20-mW 640-MHz CMOS Continuous-Time ΣΔ ADC With 20-MHz Signal Bandwidth, 80-dB Dynamic Range and 12-bit ENOB", IEEE Journal of Solid-State Circuits, vol. 41, pp. 2641-2649, Dec. 2006, pp. 2641-2649 (9 pages).

\* cited by examiner

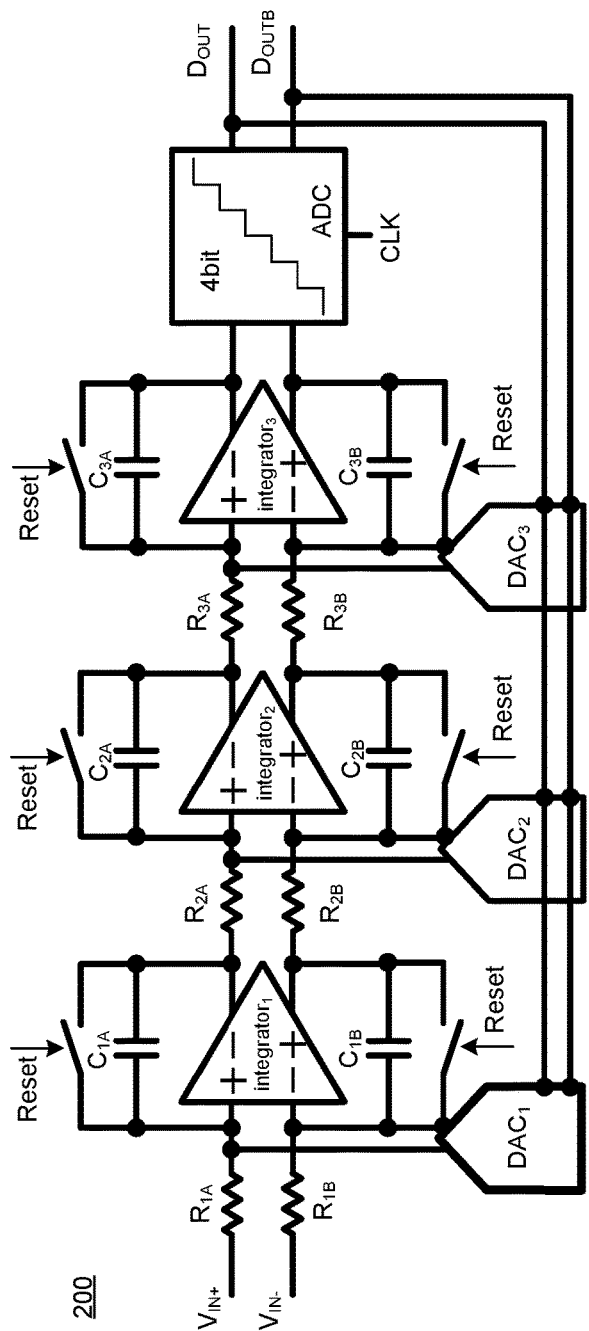
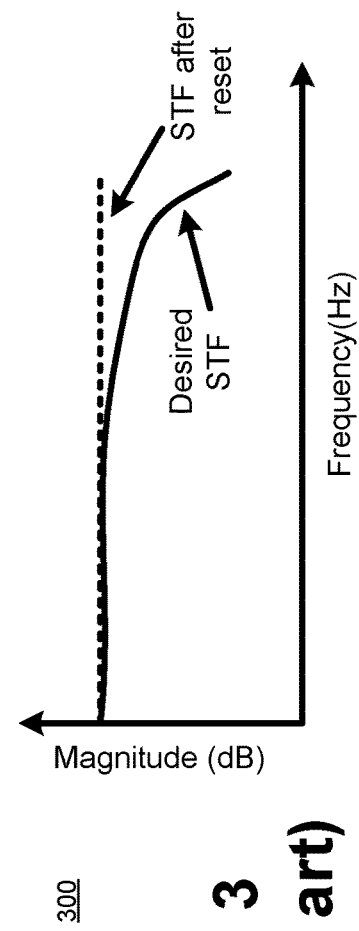
Fig. 2 (prior art)
Fig. 3 (prior art)

APPARATUS FOR OVERLOAD RECOVERY OF AN INTEGRATOR IN A SIGMA-DELTA MODULATOR

CLAIM OF PRIORITY

This Application is a Continuation of, and claims priority to, U.S. patent application Ser. No. 14/751,063, filed on 25 Jun. 2015 and titled "APPARATUS FOR OVERLOAD RECOVERY OF AN INTEGRATOR IN A SIGMA-DELTA MODULATOR," which is incorporated by reference in its entirety for all purposes.

BACKGROUND

An integrator is a component whose output signal is the time integral of its input signal. An integrator is a version of a counter, cumulating the input into an output. An integrator is a basic building block of a sigma-delta modulator based analog-to-digital converters (ADC). A Sigma-delta modulator based ADC oversamples a desired signal by a factor and filters the desired signal band. A higher order (e.g., a second or higher order) sigma-delta modulator based ADC has at least two integrators. The integrators in the sigma-delta modulator based ADC behave as low-pass filters.

An ADC (e.g., a flash ADC) in the sigma-delta modulator based ADC is used to convert the output of a chain of integrators to a digital code. The resulting digital code, along with the error generated by the discrete levels of the ADC, is fed back and subtracted from the input of the integrators. This negative feedback has the effect of noise shaping the error due to the ADC so that it does not appear in the desired signal frequencies. Because the quantization noise is introduced at the ADC, which is within the feedback loop of the sigma-delta modulator based ADC, the transfer function from the input of the ADC to its output is a high pass filter, which creates the high pass noise shaping.

Sigma-delta modulator based ADC with orders of two or higher suffer from overload instability. Here, overload instability or overload condition is a condition where an input signal saturates the ADC, and so the output of the sigma-delta modulator based ADC begins to oscillate forever. For example, the input current into each integrator of the sigma-delta modulator based ADC becomes larger than the feedback current subtracted off from the input current. As a result, the outputs of the integrators drive to power supply and ground rails. As such, the ADC within the sigma-delta modulator based ADC tries to "race to catchup" to remove the extra charge on the capacitors of the integrators, but fails. The failure of the feedback loop to remove the extra charge causes the sigma-delta modulator based ADC to become unstable (i.e., output of Sigma-delta modulator based ADC oscillates forever).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2 illustrates a sigma-delta modulator based Analog-to-Digital Converter (ADC) with switches to short the capacitors of integrators for overload recovery.

FIG. 3 illustrates a plot showing signal transfer function of the sigma-delta modulator ADC of FIG. 2 upon overload recovery.

DETAILED DESCRIPTION

Figure 1:
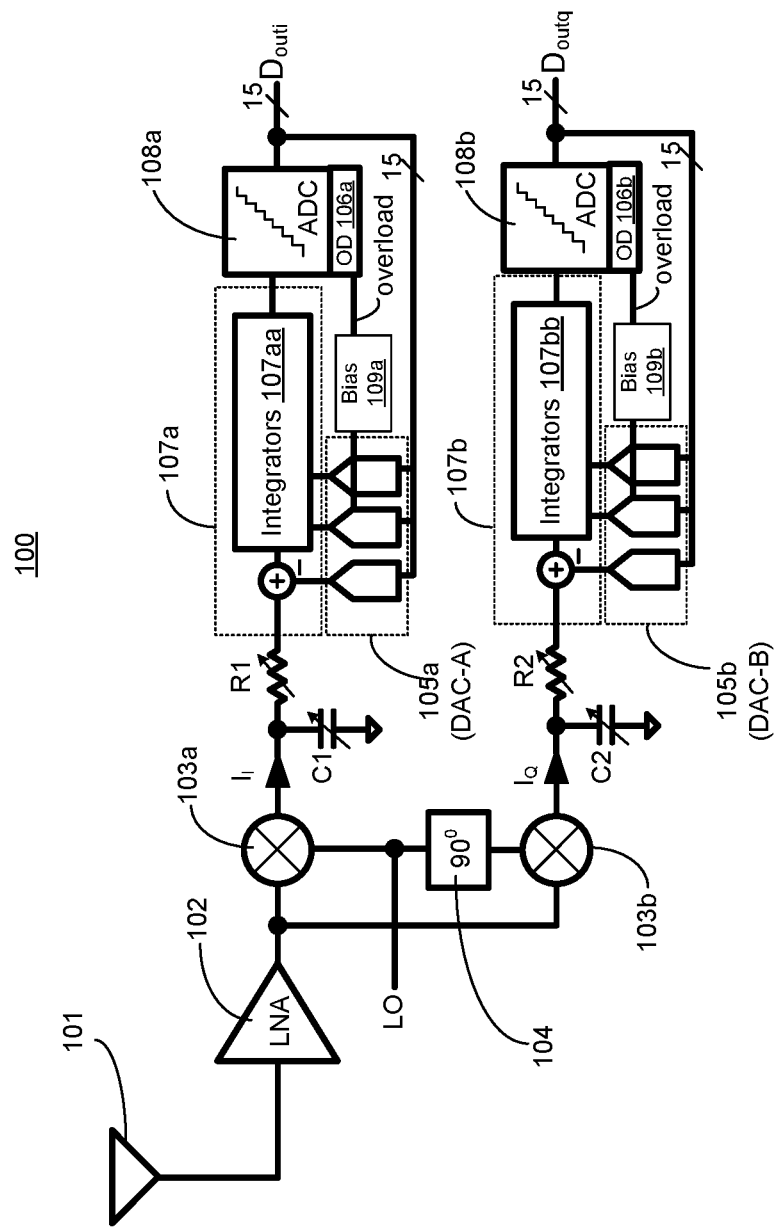
FIG. 1 illustrates a front-end of a radio-frequency (RF) apparatus with an overload detection and recovery mechanism, according to some embodiments of the disclosure.

Some embodiments describe a sigma-delta modulator based analog-to-digital converter (ADC) with apparatus to detect an overload condition and to non-invasively recover from the overload condition such that the signal transfer function of the sigma-delta modulator based ADC is maintained. The apparatus of various embodiments recovers from the overload condition in a fast fashion with little, if any, change to the noise transfer function of the sigma-delta modulator based ADC. Other technical effects will be evident from the description of the various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% (unless otherwise specified) of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

FIG. 1 illustrates front-end of a radio-frequency (RF) apparatus with overload detection and recovery mechanism, according to some embodiments of the disclosure. Apparatus 100 receives an input signal and generates a digital stream as In-phase (I) and Quadrature (Q) signals, $D_{outi}$ and $D_{outq}$, respectively. In this example, the output signals $D_{outi}$ and $D_{outq}$ are 15-bit thermometer coded signals. However, the embodiments are not limited to such. Fewer or more bits may be used for $D_{outi}$ and $D_{outq}$. Here, node names and signal names are interchangeably used. For example, the term "$D_{outi}$" may refer to the In-phase node or signal on that node depending on the context of the sentence.

In some embodiments, apparatus 100 comprises: an Antenna 101, Low Noise Amplifier (LNA) 102, Mixers 103a and 103b, Phase Shifter 104, Low-Pass Filters (R1-C1, and R2-C2), DACs 105a (DAC-A) and 105b (DAC B), Overload Detectors (OD) 106a and 106b, Loop Filters 107a and 107b, ADCs 108a and 108b, and Bias Generators 109a and 109b.

In some embodiments, Antenna 101 may comprise one or more directional or omnidirectional antennas, including monopole antennas, dipole antennas, loop antennas, patch antennas, microstrip antennas, coplanar wave antennas, or other types of antennas suitable for transmission of Radio Frequency (RF) signals. In some multiple-input multiple-output (MIMO) embodiments, Antenna(s) 101 are separated to take advantage of spatial diversity.

In some embodiments, LNA 102 receives an input from Antenna 101 and converts the weak signal received from Antenna 101 to an amplified output. Any suitable design for LNA that achieves low noise figure (NF) (e.g., NF of 1 dB) and high gain (e.g., 20 dB) can be used for implementing LNA 102.

In some embodiments, Mixers 103a and 103b are switching mixers that receive the output of LNA 102 and mix the frequency of that output by a local oscillator (LO) frequency and its phase shifted version (e.g., phase shifted by Shifter 104). Any suitable mixer design can be used for implementing Mixers 103a and 103b. In some embodiments, the outputs of Mixers 103a and 103b (i.e., $I_I$ and $I_Q$) are filtered by respective filters (R1-C1 and R2-C2).

A DAC is an apparatus that converts digital data (e.g., binary or thermometer coded) into an analog signal (current, voltage, or electric charge). In some embodiments, DACs 105a/b receive a digital code from ADCs 108a/b and provide current to the inputs of Integrators 107aa/bb. In some embodiments, DACs 105a/b are pulse width modulator DACs. In other embodiments, other types of DACs may be used for implementing DACs 105a/b. For example, interpolating DACs (also known as oversampling DACs), binary weighted DACs (e.g., switched resistor DACs, switched capacitor DACs, switched current-source DACs), R-2R ladder DAC, thermometer coded DAC, segmented DAC, etc. may be used for implementing DACs 105a/b. Any suitable DAC may be used for implementing DACs 105a/b.

In some embodiments, Loop Filters 107a/b comprise of integrators 107aa/bb. In some embodiments, the number of integrators 107aa/bb determine the order of the filter and can be built to any order. By adjusting the number of integrators 107aa/bb in Loop Filters 107a/b, different types of transfer functions can be implemented. In various embodiments here, a third order loop low pass filter is presented with no signal transfer peaking. In some embodiments, integrators 107aa/bb are built as active RC (resistor-capacitor) integrators. In other embodiments, other types of implementations may be used for building integrators 107aa/bb.

For example, GM-C integrators, passive RC integrator, etc. can be used for building integrators 107aa/bb. In some embodiments, the feedback mechanism of Loop Filters 107a/b is a feed-forward mechanism. In other embodiments, other types of feedback mechanisms can be used. For example, traditional feedback or a hybrid of the traditional feedback and feed-forward paths can be used for implementing the feedback path Filters 107a/b. In some embodiments, the analog signals (generated by DACs 105a and 105b) are subtracted from the inputs of integrator 107aa/107bb.

ADCs are apparatuses that convert continuous physical quantities (e.g., voltages) to digital numbers that represent the amplitude of the physical quantities. In some embodiments, ADCs 108a/b convert the analog output of Loop Filters 107a/b to their corresponding digital representations. Any suitable ADC may be used to implement ADCs 108a/b. For example, ADC 108a/b is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC. For purposes of explaining the various embodiments, ADCs 108a/b are considered to be flash ADCs.

In some embodiments, OD 106a/b include logic to detect consecutive cycles of an overload condition at the inputs of ADC 108a/b. For example, OD 106a/b compares two successive input signals to ADC 108a/b, respectively, and determines whether an overload condition exists. When an overload occurs within the integrators 107aa/bb of Loop Filter 107a/b, respectively, the input current into each integrators (of Integrators 107aa/bb) is larger than the feedback current of DACs 105a/b provided to Loop Filters 107a/b. This larger input current results in all integrator outputs diving to power and/or ground supply rails (e.g., Vdd and/or Vss respectively) depending on the input signal. In some embodiments, ODs 106a/b detect at least two consecutive output cycles (i.e., outputs of the integrator feeding ADCs 108a/b) at rail levels (i.e., Vdd/Vss levels) to determine whether an overload condition occurred.

In some embodiments, when an overload condition occurs, the signal "overload" is set to cause Bias Generators 109a/b to increase bias currents for higher order DACs in DACs 105a/b. In some embodiments, Bias Generators 109a/b provide constant bias signals (e.g., bias voltage or bias current) to DACs 105a/b so that DACs 105a/b can provide currents according to the outputs of ADCs 108a/b, respectively. This current is subtracted in Loop Filters 107a/b at the inputs of Integrators 107aa/bb, respectively, in accordance with some embodiments. During the overload condition(s), in some embodiments, Bias Generators 109a/b increase the current provided by the higher order DACs (e.g., $DAC_2$, $DAC_3$, etc.) to cancel out the extra charge built up in the capacitors of the overloaded integrators 107aa/bb. In some embodiments, by increasing the current provided by the higher order DACs, the signal transfer function remains unchanged (i.e., the current provided by the first order DAC (e.g., $DAC_1$) is unchanged).

FIG. 2 illustrates a sigma-delta modulator based ADC 200 with switches to short the capacitors of integrators for overload recovery. Here, a typical third order sigma-delta modulator based ADC is shown with Reset controllable switches. The third order sigma-delta modulator based ADC 200 consists of three $integrators_{1-3}$, capacitors $C_{1A}$, $C_{1B}$, $C_{2A}$, $C_{2B}$, $C_{3A}$, and $C_{3B}$, resistors $R_{1A}$, $R_{1B}$, $R_{2A}$, $R_{2B}$, $R_{3A}$, and $R_{3B}$, Reset controllable switches, flash ADC, and three $DACs_{1-3}$ coupled together as shown. Input signals (e.g., differential voltages $V_{IN+}$ and $V_{IN-}$) are first converted into current which is input to the first $integrator_1$. $DAC_1$ provides the feedback current according to differential outputs $D_{OUT}/D_{OUTB}$ to the input of the first $integrator_1$. Likewise, other DACs provide feedback current to the inputs of other integrators according to the differential outputs $D_{OUT}/D_{OUTB}$.

The Reset controllable switches are placed in parallel to the differential integrator capacitors $C_{1A}$, $C_{1B}$, $C_{2A}$, $C_{2B}$, $C_{3A}$, and $C_{3B}$. As such, when an overload condition is detected, Reset signal is activated (i.e., set to logic high or low) to cause the switches to turn on and short the two terminals of the capacitors $C_{1A}$, $C_{1B}$, $C_{2A}$, $C_{2B}$, $C_{3A}$, and $C_{3B}$. Shorting the capacitors $C_{1A}$, $C_{1B}$, $C_{2A}$, $C_{2B}$, $C_{3A}$, and $C_{3B}$ causes all memory developed in $integrators_{1-3}$ to be lost. Losing the memory is undesirable because sigma-delta modulator based ADC is an averaging ADC with noise shaping. Losing the memory affects the noise transfer function of ADC 200 which then results in loss of resolution. Another impact of shorting the capacitors $C_{1A}$, $C_{1B}$, $C_{2A}$, $C_{2B}$, $C_{3A}$, and $C_{3B}$ is that the signal transfer function of sigma-delta modulator based ADC 200 is modified resulting in passing off undesirable higher frequency components through the loop filters (i.e., upon shorting of the capacitors, the loop filter no longer behaves as a low-pass filter). This brute-force mechanism of addressing the overload condition is invasive and slow to recover from.

The apparatus of various embodiments recovers from the overload condition in a fast fashion with little, if any, change to the noise transfer function of the sigma-delta modulator based ADC. In some embodiments, the noise shaping order does not change since the integrators are not shorted. For example, if one integrator is shorted, as in FIG. 2, the noise shapes change from third to second order. Such order level change in noise transfer function is avoided in accordance with some embodiments.

FIG. 3 illustrates plot 300 showing a signal transfer function (STF) of sigma-delta modulator ADC 200 upon overload recovery. Here, x-axis is Frequency in Hertz (Hz) and y-axis is the transfer function Magnitude in (dB). The normal low-pass filter based STF is the desired STF (i.e., the solid line), while the STF after shorting the capacitors $C_{1A}$, $C_{1B}$, $C_{2A}$, $C_{2B}$, and $C_{3A}$ by resetting the switches is the undesired STF (i.e., the dotted line). Here, the undesired STF is undesired because it opens a window for passing off high-frequency components which were supposed to be filtered. Various embodiments described here maintain the desired STF during overload detection and correction. As such, the undesirable effects of the traditional sigma-delta modulator based ADCs such as ADC 200 are avoided.

Figure 4:
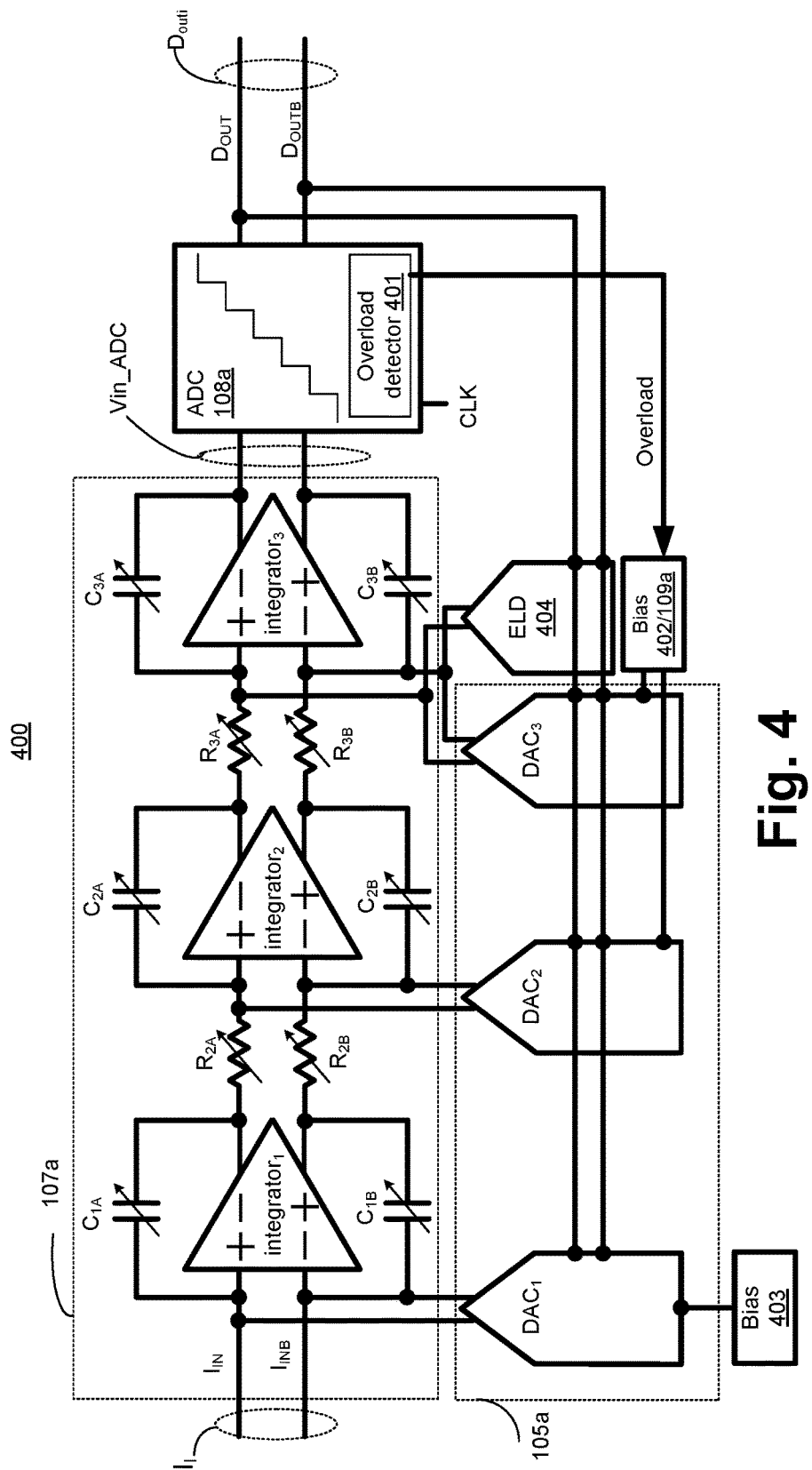
FIG. 4 illustrates a sigma-delta modulator based ADC with a non-invasive overload detection and recovery mechanism, according to some embodiments of the disclosure.

FIG. 4 illustrates a sigma-delta modulator based ADC 400 with a non-invasive overload detection and recovery mechanism, according to some embodiments of the disclosure. It is pointed out that those elements of FIG. 4 having the same reference numbers (or names) as the elements of any other figure can operate or function in any manner similar to that described, but are not limited to such. So as not to obscure the embodiments, the In-plane path is shown (i.e., the I-path). The Quadrature path (i.e., the Q-path) is similar to the I-path except that the input is modulated using a LO frequency shifted by 90°.

In some embodiments, sigma-delta modulator ADC 400 comprises a closed loop circuit including Loop filter 107a, ADC 108a, Overload Detector 401/106a, and DACs 105a. In some embodiments, Excess Loop Delay (ELD) recovery circuit 404 is coupled to the last DAC cell (here, $DAC_3$). In some embodiments, ELD recovery circuit 404 is used to stabilize sigma-delta modulator ADC 400 in the presence of delay in ADC 108a or other delays within the feedback loop. In some embodiments, ELD recovery circuit 404 has a programmable delay that can be programmed by hardware (e.g., fuses) or software. In some embodiments, ELD recovery circuit 404 has a predetermined delay.

In some embodiments, sigma-delta modulator ADC 400 is a multi-order sigma-delta modulator ADC. In this example, a third order sigma-delta modulator ADC is described. However, the embodiments are not limited to third order sigma-delta modulators based ADCs. For example, second order or fourth (and higher) order sigma-delta modulator based ADCs can be used with various embodiments.

In some embodiments, Loop Filter 107a comprises three integrators—$integrators_{1-3}$, adjustable capacitors $C_{1A}$, $C_{1B}$, $C_{2A}$, $C_{2B}$, $C_{3A}$, and $C_{3B}$, and adjustable resistors $R_{2A}$, $R_{2B}$, $R_{3A}$, and $R_{3B}$ coupled together as shown. While the embodiments illustrate a differential Loop Filter 107a that receives differential inputs $I_{IN}$ and $I_{INB}$, the embodiments are applicable to a single-ended loop filter. In this example, the differential inputs are differential currents $I_{IN}$ and $I_{INB}$. However, the embodiments are not limited to input currents. In some embodiments, the input currents from Mixers 103a and 103b can be converted to voltages and those voltages are input to respective Loop Filters 107a and 107b. In some embodiments, the input resistors (e.g., $R_{2A}$, $R_{2B}$, $R_{3A}$, and $R_{3B}$ which are coupled to inputs of $integrators_{2-3}$) are used to convert the output voltage (i.e., the output of the previous integrator) back into current.

In some embodiments, DAC(s) 105a subtract an analog signal from the input of Loop Filter 107a to complete a closed loop for generating a running average for the differential outputs $D_{OUT}$ and $D_{OUTB}$. In this example, a multi-order sigma-delta modulator based ADC is described which includes $DAC_1$, $DAC_2$, and $DAC_3$. In some embodiments, each DAC has one or more DAC cells. In some embodiments, $DAC_1$ subtracts an analog signal from the input analog signal(s) which are input to integrator$_1$.

In this example, the analog signal(s) from $DAC_1$ are differential currents which are subtracted from the input differential currents $I_{IN}$ and $I_{INB}$. In some embodiments, $DAC_2$ subtracts an analog signal from the input analog signal(s) which are input to integrator$_2$. In this example, the analog signal(s) from $DAC_2$ are differential currents which are subtracted from the input differential currents that are input to integrator$_2$, where the input differential currents here are the output(s) of integrator$_1$. In some embodiments, $DAC_3$ subtracts an analog signal from the input analog signal(s) which are input to integrator$_3$. In this example, the analog signal(s) from $DAC_3$ are differential currents which are subtracted from the input differential currents that are input to integrator$_3$, where the input differential currents here are the output(s) of integrator$_2$.

In some embodiments, Overload Detector 401 monitors the input Vin_ADC to determine whether an overload condition occurred. In some embodiments, Overload Detector 401 includes logic to detect consecutive cycles of an overload condition on Vin_ADC (which is input to ADC 108a). For example, Overload Detector 401 compares two successive cycles of Vin_ADC and determines whether an overload condition exists. In some embodiments, Overload Detector 401 senses signal swings of Vin_ADC outside of the normal quantizer range. While the embodiments illustrate Overload Detector 401 as being part of ADC 108a, it can be outside of ADC 108a in accordance to some embodiments.

When an overload occurs within the integrators$_{1-3}$ of Loop Filter 107a respectively, the input current into each integrator is larger than the feedback current of DACs 105a provided to Loop Filters 107a. This larger input current results in all integrator outputs rising or falling to power and/or ground supply rails (e.g., Vdd and Vss), respectively, depending on the input signal. In some embodiments, Overload Detector 401 detects at least two consecutive output cycles of Vin_ADC (i.e., the output of integrator$_3$ feeding ADC 108a) at rail levels (i.e., Vdd and/or Vss levels) to determine whether an overload condition occurred. In some embodiments, Overload Detector 401 detects at least two consecutive output cycles of Vin_ADC (i.e., the output of integrator$_3$ feeding ADC 108a) at threshold levels (e.g., near Vdd and/or Vss levels) to determine whether an overload condition occurred. In some embodiments, the threshold levels can be programmed to determine when and what constitutes an overload condition.

In some embodiments, when an overload condition occurs, the signal "overload" is set to cause Bias Generator 402/109 to increase bias currents for higher order DACs (i.e., $DAC_2$ and $DAC_3$). For example, the currents within the feedback $DACs_{2-3}$ are temporally increased for a short period of time to remove this extra charge accumulated on integrators$_{2-3}$. In some embodiments, Bias Generator 402 provides constant bias signals (e.g., bias voltage or bias current) to $DACs_{2-3}$ so that $DACs_{2-3}$ can provide currents according to the outputs of ADCs 108a. In some embodiments, another Bias Generator 403 is used to provide bias signals (e.g., bias voltage or bias current) to $DAC_1$ independent of the overload condition. As such, the output current of $DAC_1$ does not change by the overload signal. The currents from $DACs_{1-3}$ are subtracted in Loop Filters 107a at the inputs of integrators$_{1-3}$, respectively, in accordance with some embodiments. During overload condition(s), in some embodiments, Bias Generator 402 increases the current provided by the higher order DACs (i.e., $DAC_{2-3}$) to cancel out the extra charge built up in the capacitors of the higher order overloaded integrators$_{2-3}$.

In one such embodiment, the bias current/voltage to $DAC_1$ is maintained (i.e., it remains unchanged regardless of detection of an overload condition). By keeping the maximum current constant for $DAC_1$ (i.e., by not changing its bias voltage/current levels), 0 dB passband is achieved (i.e., no change in normal operation). As such, the dominant pole of the system is not disturbed and the signal transfer function retains its low pass filter attributes (i.e., the STF of sigma-delta modulator based ADC 400 is not changed due to not influencing any dominant factor in the forward path of Loop Filter 107a). During overload recovery, in some embodiments, all feedback is still maintained with all DACs, and the DACs continue to function according to the Quantizer (i.e., ADC 108a) output but with increased currents for higher order DACs (i.e., $DACs_{2-3}$).

Figure 5:
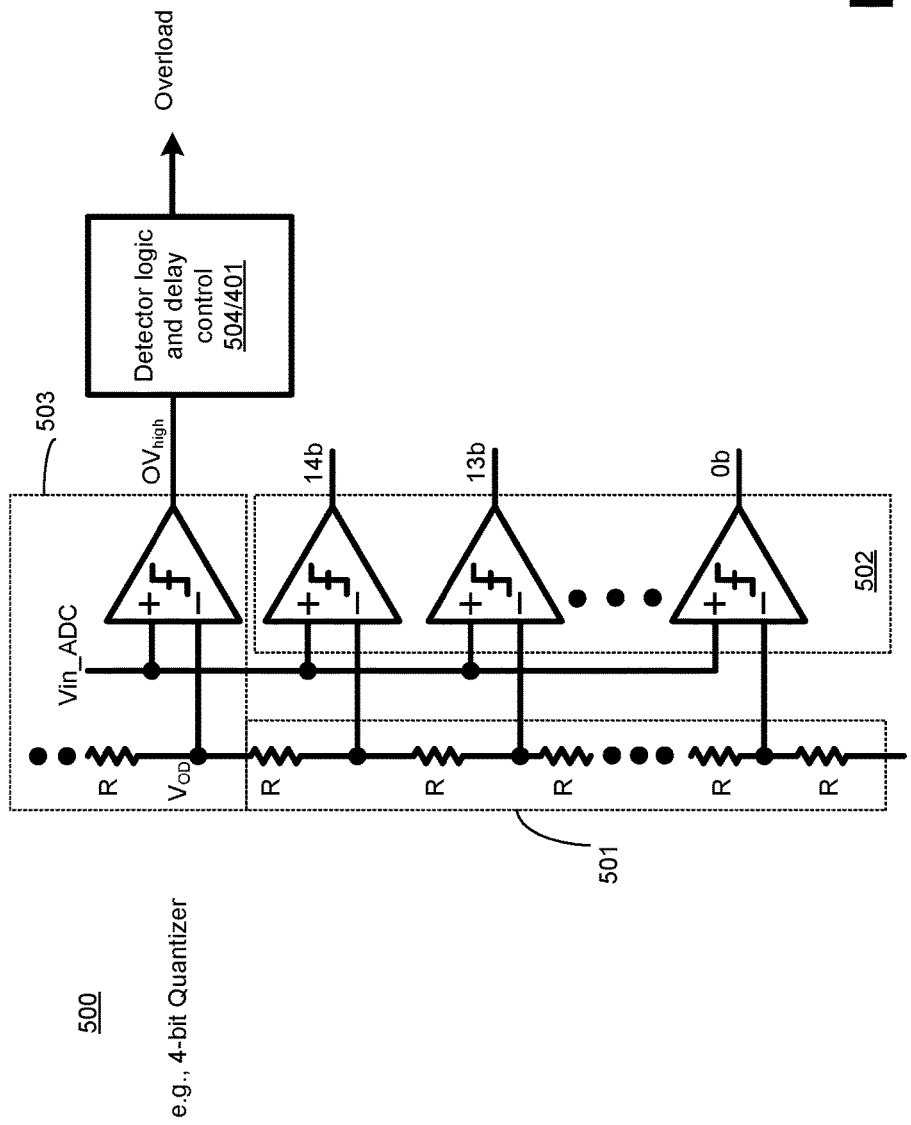
FIG. 5 illustrates an ADC of the sigma-delta modulator based ADC with an overload detection apparatus, according to some embodiments of the disclosure.

FIG. 5 illustrates ADC 500/108a (also referred to as the Quantizer) of sigma-delta modulator based ADC 400 with an overload detection apparatus, according to some embodiments of the disclosure. It is pointed out that those elements of FIG. 5 having the same reference numbers (or names) as the elements of any other figure can operate or function in any manner similar to that described, but are not limited to such.

In some embodiments, ADC 500/108a comprises a plurality of resistors 501 coupled together in series (where each resistor has resistance 'It') and a plurality of comparators 502. In some embodiments, the inputs to comparators 502 are Vin_ADC and the resistor divider nodes. Here, labels for signal names and node names are interchangeably used. For example, Vin_ADC may refer to signal Vin_ADC or Vin_ADC node depending on the context of the sentence.

In some embodiments, the outputs of comparators 502 together form a digital code which is provided to the $DACs_{1-3}$. In this example, a 15-bit code is provided as output by comparators 502. However, any level of quantization can be performed (i.e., number of output bits can be fewer or greater than 15 bits). In some embodiments, an additional quantizer 503 is provided for the overload detection. Here, additional quantizer 503 is added for detecting logic high levels (e.g., Vcc levels) of Vin_ADC. For example, an additional resistor R is coupled in series with resistors 501 to provide quantizer level $V_{OD}$ to an extra comparator of quantizer 503. In some embodiments, the extra comparator compares $V_{OD}$ against Vin_ADC to generate an output (Who, which is received as input by Detector logic and delay control 504 (same as Overload detector 401).

In some embodiments, an additional quantizer (not shown) is provided for detecting consecutive logic low levels (e.g., Vss levels) instead of detecting consecutive high levels. For example, an additional resistor R is coupled in series at the other end of resistors 501 to provide a low quantizer level to an extra comparator (not shown). In some embodiments, at least two additional quantizers are added— one for detecting logic high levels (e.g., Vcc) and one for detecting logic low levels (e.g., Vss).

In some embodiments, when an overload condition is detected (e.g., by detecting two consecutive cycles of logic high ($OV_{high}$) and/or by detecting two consecutive cycles of logic low) a predetermined delay is added to the Overload signal which is then passed on to Bias Generator 402. In some embodiments, Detector 504 is implemented using a chain of shift registers (not shown) with ANDing logic. In some embodiments, Detector 504 includes a clock divider instead of shift registers. Any suitable logic can be used for implementing Detector 504 which is capable of detecting two or more consecutive high or low cycles.

Figure 6:
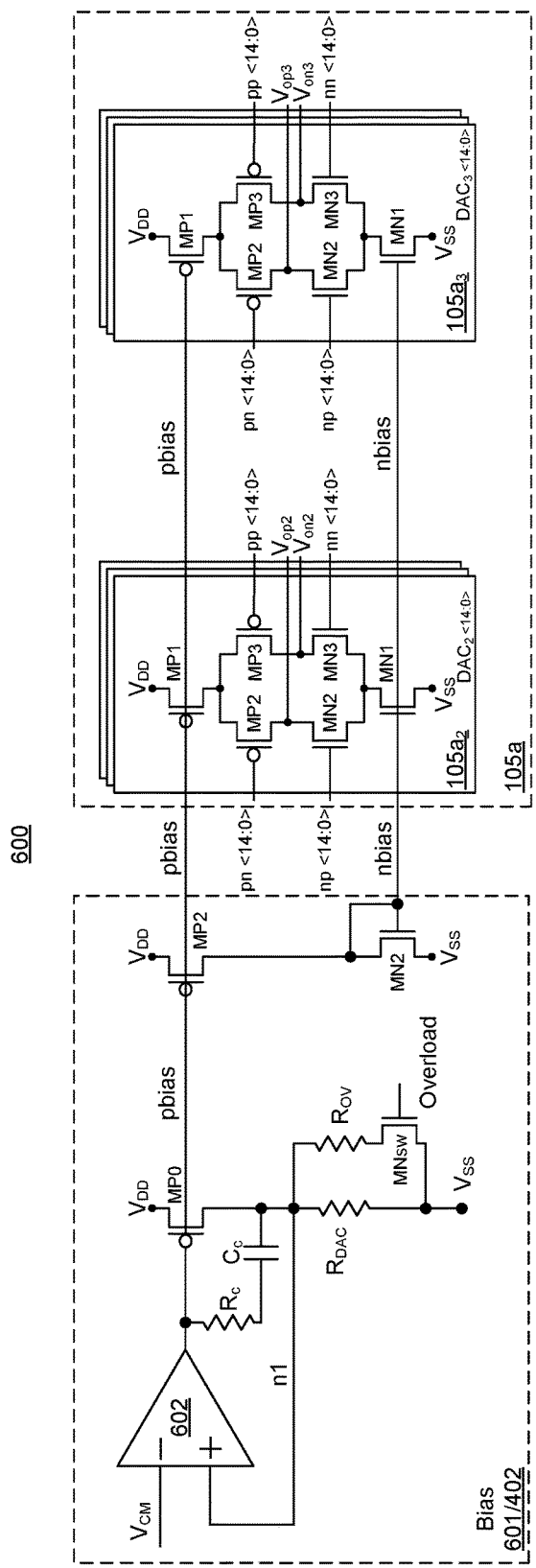
FIG. 6 illustrates a bias generator for biasing the higher order digital-to-analog converters (DACs) according to the output of the overload detection apparatus, according to some embodiments of the disclosure.

FIG. 6 illustrates an apparatus 600 with bias generator 601 (e.g., 402) for biasing the higher order DACs (e.g., $DACs_{2-3}$) according to the output of the overload detection apparatus, according to some embodiments of the disclosure. It is pointed out that those elements of FIG. 6 having the same reference numbers (or names) as the elements of any other figure can operate or function in any manner similar to that described, but are not limited to such.

In some embodiments, bias generator 601 comprises amplifier 602, resistors $R_{DAC}$ and $R_{OV}$, p-type transistors MP0 and MP2, and n-type transistors $MN_{SW}$ and MN2 coupled together as shown. While the embodiments of bias generator 601 are illustrated with one amplifier 602 for simplicity sake, the embodiments are not limited to such. In some embodiments, biasing can be designed with more amplifiers and with replicas of the DAC for more precise biasing.

In some embodiments, resistor $R_c$ and capacitor $C_c$ are added to provide compensation to the amplifier feedback loop. In some embodiments, the overload resistor $R_{OV}$ is coupled in parallel to the DAC resistor $R_{DAC}$ via transistor $MN_{SW}$, where transistor $MN_{SW}$ is controlled by the Overload signal. In some embodiments, resistor $R_{DAC}$ is a copy of resistors $R_{2A}$, $R_{2B}$, $R_{3A}$, and/or $R_{3B}$ within Loop Filter 107a. In some embodiments, when an overload condition is detected, the Overload signal is set high which turns on transistor $MN_{SW}$. As such, the effective resistance coupled in series to transistor MP0 reduces. Reduced resistance in turn causes the feedback loop of amplifier 602 to reduce voltage level of pbias and thus increasing the DAC currents which are mirrored to $DAC_2$ and $DAC_3$.

In some embodiments, a common mode voltage $V_{CM}$ of sigma-delta modulator ADC 400 is provided as input to amplifier 602. In some embodiments, by taking the $V_{CM}$ and forcing this over resistor $R_{DAC}$ on node n1, matching is achieved between the input resistance of each integrator stage and the feedback currents. Since the input signal to each integrator has a resistor (e.g., resistor $R_{2A}$) with one side at $V_{CM}$, the summation node, the $V_{CM}$ received by amplifier 602 needs to be over resistor $R_{DAC}$ on node n1 to function like the one in the integrator, in accordance with some embodiments. As such, matching of DAC current steps to voltage over the input resistor in the integrator is achieved, in accordance with some embodiments. In some embodiments, the resistance of $R_{OV}$ is selected by the generated delay values determined in Detector Logic and Delay control 504.

In some embodiments, bias generator 601 provides nbias and pbias to $DACs_{2-3}$ (i.e., $105_{a2}$ and $105_{a3}$). In some embodiments, $DAC_2$ comprises p-type transistors MP1, MP2, and MP3, and n-type transistors MN1, MN2, and MN3 coupled together as shown. In this example, fifteen DAC cells (i.e., <14:0>) are coupled in parallel because the output digital code from ADC 108a are fifteen bits. In some embodiments, the pbias is received by transistor MP1 and the nbias is received by transistor MN1. In some embodiments, transistor MP2 is controlled by pn<14:0>, transistor MP3 is controlled by pp<14:0>, transistor MN2 is controlled by np<14:0> and transistor MN3 is controlled by nn<14:0>.

The outputs of $DAC_2$ are $V_{op2}$ and $V_{on2}$. In some embodiments, $DAC_3$ is identical in design as $DAC_2$. While the embodiments are described with reference to fifteen DAC cells and fifteen digital code bits, any number of DAC cells and corresponding ADC output size may be used.

In some embodiments, $DAC_1$ (which has a design similar to $DACs_{2-3}$) receives the nbias and pbias from another bias generator (not shown) which does allow transistor $MN_{SW}$ to turn on. In some embodiments, for purposes of having a matched design between the two bias generators, transistor $MN_{SW}$ and resistor $R_{OV}$ are connected as shown in bias generator 601 but in one case, the Overload signal is not provided and transistor $MN_{SW}$ is turned off while in the other case Overload signal is provided to transistor $MN_{SW}$. As such, the Overload signal does not change the pbias and nbias of one of the bias generators that provides biases (i.e., pbias and nbais) to $DAC_1$.

Figure 7:
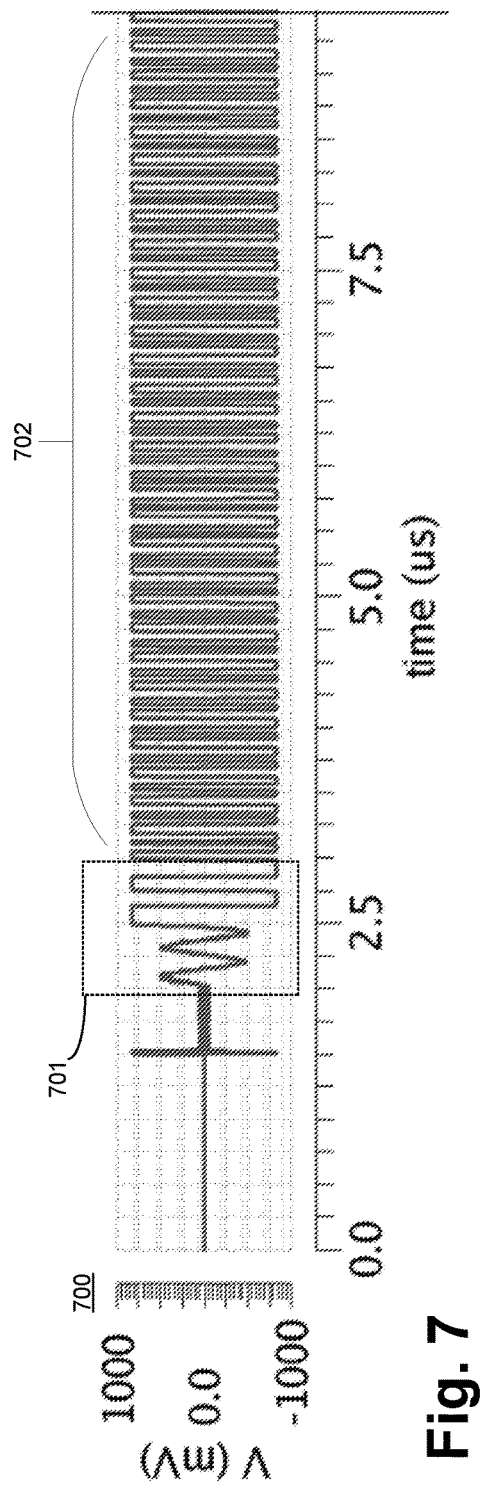
FIG. 7 illustrates a plot showing input to the ADC (i.e., quantizer) of the sigma-delta modulator based ADC without any apparatus to detect and recover from an overload condition.

FIG. 7 illustrates plot 700 showing input to ADC (i.e., quantizer) of the sigma-delta modulator based ADC without apparatus to detect and recover from overload. Here, x-axis is time in microseconds (μs) and y-axis is voltage in millivolts (mV). Region 701 shows when sigma-delta modulator based ADC 200 enters the overload condition. In the initial part of region 701 (e.g., between 1 μs to about 2.5μ), a normal sinewave input is seen at the input of ADC 108a. Region 702 shows when the overload condition persists and the input to ADC 108a oscillates between the power supply rails (Vcc and Vss) for a long time, and possibly forever.

Figure 8:
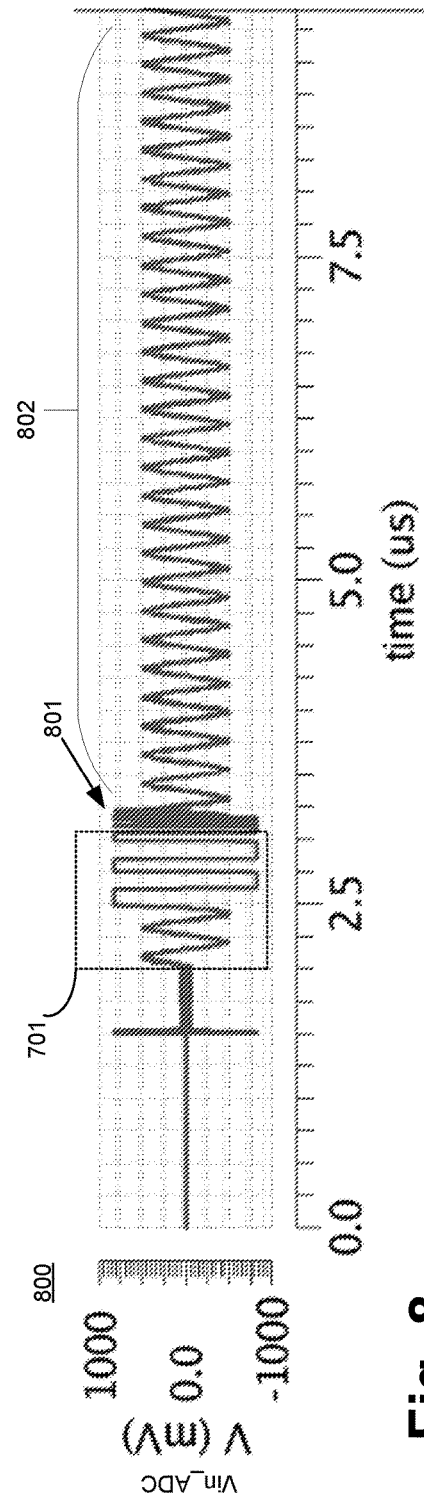
FIG. 8 illustrates a plot showing input to the ADC (i.e., quantizer) of the sigma-delta modulator based ADC with an apparatus enabled to detect and recover from overload, according to some embodiments of the disclosure.

FIG. 8 illustrates plot 800 showing input to ADC 108a (i.e., quantizer) of the sigma-delta modulator based ADC 400 with apparatus enabled to detect and recover from overload, according to some embodiments of the disclosure. It is pointed out that those elements of FIG. 8 having the same reference numbers (or names) as the elements of any other figure can operate or function in any manner similar to that described, but are not limited to such.

In some embodiments, when sigma-delta modulator based ADC 400 enters the overload condition, Overload Detector 401 identifies at least two consecutive logic highs and or logic lows of Vin_ADC in Region 801. When Overload Detector 401 identifies an overload condition, the Overload signal is asserted which turns on transistor $MN_{SW}$ which in turn increases the current provided by higher order $DACs_{2-3}$ to the inputs of $integrators_{2-3}$. As such, the overload condition of $integrators_{2-3}$ is cancelled and the input Vin_ADC begins to process the input sinewave normally as shown by region 802. In this example, ADC 108a quickly recovers to normal operation after the overload is removed from the input Vin_ADC. For example, sigma-delta modulator based ADC 400 settles back to normal operation within a short time (e.g., 100 ns) as shown in 801.

Figure 9:
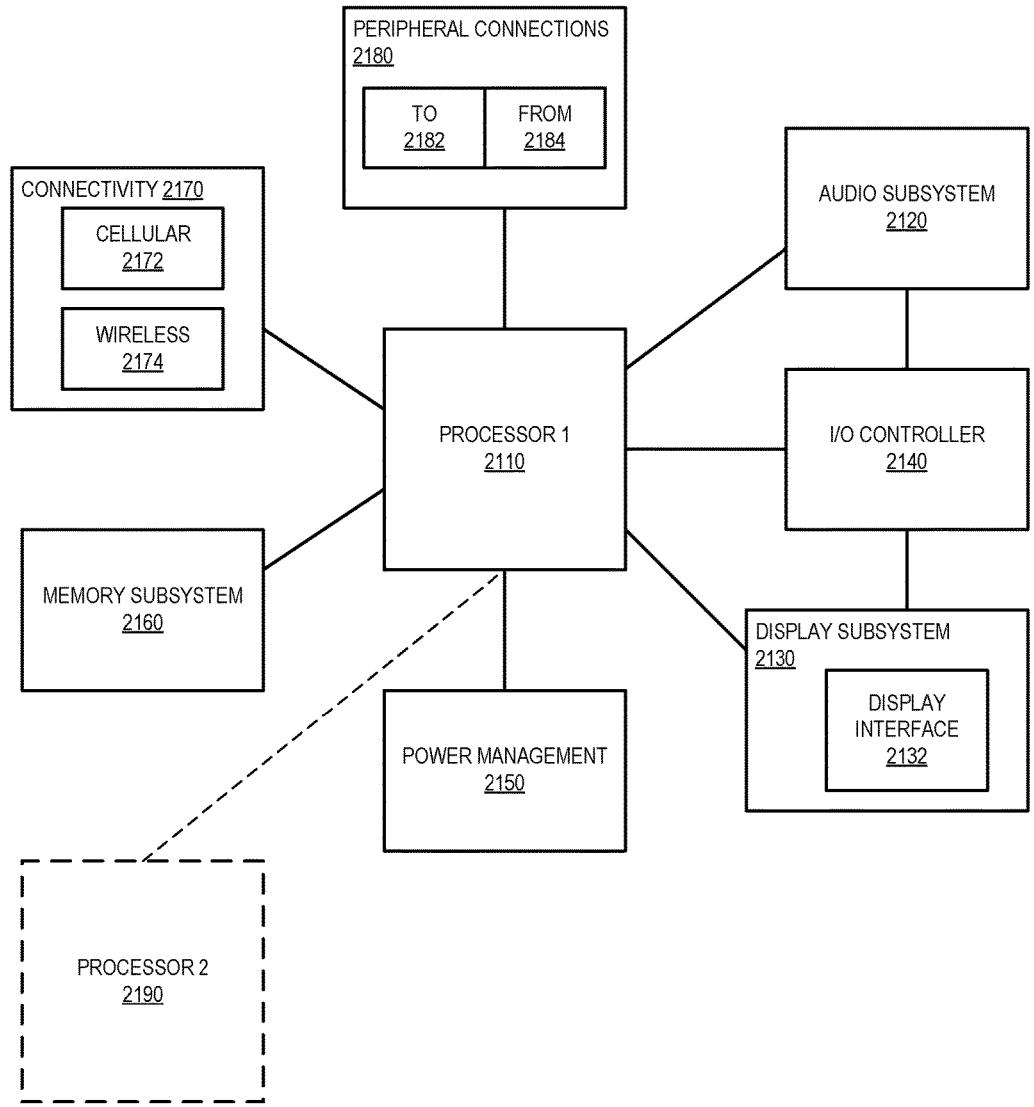
FIG. 9 illustrates a smart device or a computer system or a SoC (System-on-Chip) with an apparatus to detect and recover from overload, according to some embodiments.

FIG. 9 illustrates a smart device or a computer system or a SoC (System-on-Chip) 2100 with sigma-delta modulator based ADC having apparatus enabled to detect and recover from overload, according to some embodiments. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with the apparatus to detect and recover from overload, according to some embodiments discussed. Other blocks of the computing device 2100 may also include a sigma-delta modulator based ADC having apparatus to detect and recover from overload, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110. In some embodiments, audio subsystem 2120 includes a sigma-delta modulator based ADC having apparatus to detect and recover from overload.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user. In some embodiments, Display subsystem 2130 includes a sigma-delta modulator based ADC having apparatus to detect and recover from overload.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. Memory subsystem 2160 may include a sigma-delta modulator based ADC having apparatus to detect and recover from overload, according to some embodiments.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication. In some embodiments, Cellular connectivity 2172 includes the apparatus to improve linearity of a DAC. For example, Cellular connectivity 2172 includes the front-end RF receiver of FIG. 1 with a sigma-delta modulator based ADC having apparatus enabled to detect and recover from overload.

Referring back to FIG. 9, in some embodiments, Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first integrator to receive an input signal and to generate a first output; a second integrator to receive the first output or a version of the first output and is to generate a second output; and an analog-to-digital converter (ADC) to quantize the second output into a digital representation, the ADC including a detection circuit which is to detect an overload condition in the second output. In some embodiments, the detection circuit comprises logic to detect at least two consecutive cycles of the overload condition in the second output, and wherein the logic is to generate an output indicating whether the overload condition is detected.

In some embodiments, the overload condition occurs when the second output reaches voltage levels of at least one of the power rails. In some embodiments, the apparatus comprises first digital-to-analog converter (DAC) to provide a first analog signal which is combined with the input signal, wherein the first DAC is to adjust a signal attribute of the first analog signal according to at least a part of the digital representation and independent of the output of the logic of the detection circuit. In some embodiments, the apparatus comprises: a second digital-to-analog converter (DAC) to provide a second analog signal which is combined with the first output from the first integrator, wherein the second DAC is to adjust a signal attribute of the second analog signal according to at least a part of the digital representation and the output of the logic of the detection circuit.

In some embodiments, the signal attribute is a current, and wherein the output of the detection circuit is to increase the current of the second DAC. In some embodiments, a bias generator which is to receive the output of the detection circuit and adjust a bias for the second DAC. In some embodiments, the ADC includes a comparator for providing an output for the detection circuit, wherein the comparator is in addition to comparators of the ADC used for quantizing the second output into the digital representation. In some embodiments, the first and second integrators are differential integrators.

In another example, a system is provided which comprises: an antenna; an integrated circuit (IC) coupled to the antenna, the IC including a sigma-delta modulator having an apparatus as described above; and a processor coupled to the IC.

In another example, a sigma-delta modulator is provided which comprises: a loop filter having at least two integrators; and an analog-to-digital converter (ADC) to quantize an output of the loop filter into a digital representation, the ADC including a detection circuit which is to detect an overload condition in the output of the loop filter. In some embodiments, the detection circuit comprises logic to detect at least two cycles of the overload condition in the output, and wherein the logic is to generate an indicator indicating whether the overload condition is detected.

In some embodiments, the sigma-delta modulator comprises at least two digital-to-analog converters (DACs). In some embodiments, at least one of the DACs is to provide a first analog signal which is combined with an input signal to be received by at least one of the integrators, and wherein the at least one of the DACs is to adjust a signal attribute of the first analog signal according to at least a part of the digital representation and independent of the output of the detection circuit. In some embodiments, at least one of the DACs is to provide a second analog signal which is combined with an output of at least one of the integrators, and wherein the at least one of the DACs is to adjust a signal attribute of the second analog signal according to at least a part of the digital representation and the output of the detection circuit.

In some embodiments, at least one of the DACs is to receive a bias independent of the output of the detection circuit. In some embodiments, at least one of the DACs is to receive a bias dependent on the output of the detection circuit. In some embodiments, the ADC includes a comparator for providing an output for the detection circuit, and wherein the comparator is in addition to comparators of the ADC used for quantizing the output into the digital representation.

In another example, a system is provided which comprises: an antenna; an integrated circuit (IC) coupled to the antenna, the IC including a sigma-delta modulator as described above; and a processor coupled to the IC.

In another example, a method is provided which comprises: receiving, by a first integrator, an input signal wherein the first integrator is to generate a first output; receiving, by a second integrator, the first output or a version of the first output and wherein the second integrator is to generate a second output; and quantizing, by an analog-to-digital converter (ADC), the second output into a digital representation; and detecting an overload condition in the second output from the digital representation.

In some embodiments, detecting the overload condition comprises: detecting at least two consecutive cycles of the overload condition in the second output; and generating an output indicating whether the overload condition is detected. In some embodiments, the overload condition occurs when the second output reaches voltage levels of at least one of the power rails.

In some embodiments, the method comprises: providing, by a first digital-to-analog converter (DAC), a first analog signal; combining the first analog signal with the input signal; and adjusting, by the first DAC, a signal attribute of the first analog signal according to at least a part of the digital representation and independent of the overload condition. In some embodiments, the method comprises: providing, by a second DAC, a second analog signal; combining the second analog signal with the first output from the first integrator; and adjusting, by the second DAC, a signal attribute of the second analog signal according to at least a part of the digital representation and the overload condition.

In some embodiments, the signal attribute is a current, and wherein the overload condition is to cause an increase in the current of the second DAC. In some embodiments, the method comprises: receiving an output indicating the overload condition; and adjusting a bias for the second DAC according to the output.

In another example, an apparatus is provided which comprises: first means for receiving an input signal wherein the first means is to generate a first output; second means for receiving the first output or a version of the first output and wherein the second means is to generate a second output; and means for quantizing the second output into a digital representation; and means for detecting an overload condition in the second output from the digital representation.

In some embodiments, the means for detecting the overload condition comprises: means for detecting at least two consecutive cycles of the overload condition in the second output; and means for generating an output indicating whether the overload condition is detected. In some embodiments, the overload condition occurs when the second output reaches voltage levels of at least one of the power rails. In some embodiments, the apparatus comprises: means for providing a first analog signal; means for combining the first analog signal with the input signal; and means for adjusting a signal attribute of the first analog signal according to at least a part of the digital representation and independent of the overload condition.

In some embodiments, the apparatus comprises: means for providing a second analog signal; means for combining the second analog signal with the first output from the first means; and means for adjusting a signal attribute of the second analog signal according to at least a part of the digital representation and the overload condition. In some embodiments, the signal attribute is a current, and wherein the overload condition is to cause an increase in the current of the second DAC. In some embodiments, the apparatus comprises: means for receiving an output indicating the overload condition; and means for adjusting a bias for the second DAC according to the output.

In another example, a system is provided which comprises: an antenna; an IC coupled to the antenna, the IC including a sigma-delta modulator having an apparatus as described above; and a processor coupled to the IC.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an amplifier having an input and an output;
   a capacitor coupled to the input and the output of the amplifier;
   an analog-to-digital converter (ADC) coupled to the output of the amplifier;
   a Digital-to-Analog converter (DAC) coupled to an output of the ADC and to the input of the amplifier; and
   a circuitry coupled to the output of the ADC and the output of the DAC, wherein the circuitry is to compensate for an excess delay of at least a portion of a feedback path comprising the ADC, wherein the DAC comprises:
   a p type current source;

a first p-type transistor coupled in series with the p-type current source;
a first n-type transistor coupled in series with the first p-type transistor; and
an n-type current source coupled in series with the first n-type transistor.

2. The apparatus of claim 1, wherein the circuitry is to compensate the excess delay associated with the ADC and DAC timing.

3. The apparatus of claim 1, wherein the amplifier is part of an integrator.

4. The apparatus of claim 1, wherein the circuitry is programmable.

5. The apparatus of claim 1, wherein the amplifier is a differential amplifier.

6. The apparatus of claim 1, wherein the ADC is a flash ADC.

7. The apparatus of claim 1 comprises a resistor coupled to the capacitor.

8. The apparatus of claim 1, wherein the DAC is a capacitive DAC.

9. The apparatus of claim 1, wherein the amplifier, capacitor, ADC, DAC, and circuitry are part of a sigma-delta modulator.

10. The apparatus of claim 9, wherein the sigma-delta modulator is a multi-order sigma delta modulator.

11. An apparatus comprising:
integrator having an input and an output;
an analog-to-digital converter (ADC) coupled to the output of the integrator;
a Digital-to-Analog converter (DAC) coupled to an output of the ADC and to the input of the integrator; and
circuitry coupled to the output of the ADC and the input of the integrator, wherein the DAC comprises:
a p-type current source;
a first p-type transistor coupled in series with the p-type current source;
a first n-type transistor coupled in series with the first p-type transistor; and
an n-type current source coupled in series with the first n-type transistor.

12. The apparatus of claim 11, wherein the circuitry is to compensate a delay of at least a portion of a loop formed by the integrator, the ADC, and the DAC.

13. The apparatus of claim 11, wherein the amplifier, capacitor, ADC, DAC, and circuitry are part of a sigma-delta modulator.

14. The apparatus of claim 13, wherein the sigma-delta modulator is a multi-order sigma delta modulator.

15. An apparatus comprising:
means for integrating an analog input current and generating an analog output;
means for converting the analog output to a corresponding digital output;
means for converting the corresponding digital output to an analog current, wherein the means for converting the corresponding digital output to the analog current includes a p-type current source a first p-type transistor coupled in series with the p-type current source; a first n-type transistor coupled in series with the first p-type transistor; and an n-type current source coupled in series with the first n-type transistor;
means for compensating an excess delay associated with the means for converting the analog output, and for generating an output current; and
means for summing the analog current with the analog input current and the output current.

16. The apparatus of claim 15, wherein the means for integrating includes means for amplifying the analog input current.

17. The apparatus of claim 15, wherein the means for integrating, the means converting the analog output, the means for converting the corresponding digital output, the means for compensating, and the means for summing are part of a sigma-delta modulator.

18. The apparatus of claim 17, wherein the sigma-delta modulator is a multi-order sigma delta modulator.

19. An apparatus comprising:
a first amplifier having an input and an output;
a second amplifier having an input and an output;
a resistor coupled to the output of the first amplifier and the input of the second amplifier;
a first capacitor coupled to the input and the output of the first amplifier;
a second capacitor coupled to the input and the output of the second amplifier;
a analog-to-digital converter coupled to the output of the second amplifier;
a digital-to-analog converter coupled to an output of the analog-to-digital converter, wherein an output of the digital-to-analog converter is coupled to the input of the first amplifier; and
a compensation circuit having an input coupled to the output of the analog-to-digital converter, wherein the compensation circuit has an output coupled to the input of the second amplifier, wherein the digital-to-analog converter comprises: a p-type current source; a first p-type transistor coupled in series with the p-type current source; a first n-type transistor coupled in series with the first p-type transistor; and an n-type current source coupled in series with the first n-type transistor.

20. The apparatus of claim 19, wherein the compensation circuit is to compensate an excess delay associated with the analog-to-digital converter and digital-to-analog converter timing.

21. A communication device comprising:
an antenna;
a low noise amplifier coupled to the antenna;
a mixer coupled to an output of the low noise amplifier;
a filter coupled to the output of the mixer; and
a sigma-delta modulator with an excess delay compensation circuitry, wherein the sigma-delta modulator is coupled to the first filter, wherein the sigma-delta modulator comprises a digital to analog converter which includes:
a p type current source;
a first p-type transistor coupled in series with the p-type current source;
a first n-type transistor coupled in series with the first p-type transistor; and
an n-type current source coupled in series with the first n-type transistor.

22. The communication device of claim 21, wherein the mixer is a first mixer, wherein the filter is a first filter, and wherein the sigma-delta modulator is a first sigma-delta modulator comprises:
a second mixer coupled to an output of the low noise amplifier;
a second filter coupled to the output of the second mixer; and
a second sigma-delta modulator with an excess delay compensation circuitry, wherein the second sigma-delta modulator is coupled to the second filter.

23. The communication device of claim 22, wherein the first mixer is to receive a first clock, wherein the second mixer is to receive a second clock, and wherein there the first clock and the second clock have different phases.

24. The communication device of claim 23, wherein each of the first and second sigma-delta modulators comprises:
an amplifier having an input and an output;
a capacitor coupled to the input and the output of the amplifier;
an analog-to-digital converter (ADC) coupled to the output of the amplifier;
a Digital-to-Analog converter (DAC) coupled to an output of the ADC and to the input of the amplifier; and
the excess delay compensation circuitry coupled to the output of the ADC and the output of the DAC, wherein the excess delay compensation circuitry is to compensate for an excess delay of at least a portion of a feedback path comprising the amplifier.

25. An apparatus comprising:
an integrator to integrate an analog input current and for generating an analog output;
a analog-to-digital converter to convert the analog output to a corresponding digital output;
a digital-to-analog converter to convert the corresponding digital output to an analog current;
circuit for compensating excess delay associated with the analog-to digital converter, wherein the circuit is to generate an output current; and
a node for summing the analog current with the analog input current and the output current, wherein the digital-to-analog converter comprises: a p-type current source; a first p-type transistor coupled in series with the p-type current source; a first n-type transistor coupled in series with the first p-type transistor; and an n-type current source coupled in series with the first n-type transistor.

26. The apparatus of claim 25, wherein the integrator, analog-to-digital converter, digital-to-analog converter, and circuit are part of a sigma-delta modulator.

27. The apparatus of claim 26, wherein the sigma-delta modulator is a multi-order sigma delta modulator.

28. An apparatus comprising:
an amplifier having an input and an output;
a capacitor coupled to the input and the output of the amplifier;
an analog-to-digital converter (ADC) coupled to the output of the amplifier;
a Digital-to-Analog converter (DAC) coupled to an output of the ADC and to the input of the amplifier; and
a circuitry coupled to the output of the ADC and the input of the amplifier, wherein the circuitry is to compensate for an excess delay of at least a portion of a feedback path comprising the ADC, wherein the DAC comprises:
a p-type current source;
a first p-type transistor coupled in series with the p-type current source;
a first n-type transistor coupled in series with the first p-type transistor; and
an n-type current source coupled in series with the first n-type transistor.

29. The apparatus of claim 28, wherein the amplifier, capacitor, ADC, DAC, and circuitry are part of a sigma-delta modulator.

30. The apparatus of claim 28, wherein the sigma-delta modulator is a multi-order sigma delta modulator.

31. The apparatus of claim 28, wherein the circuitry is to compensate the excess delay associated with the ADC and DAC timing.

32. The apparatus of claim 28, wherein the sigma-delta modulator is a multi-order sigma delta modulator.

33. A method comprising:
integrating an analog input current and generating an analog output;
converting the analog output to a corresponding digital output;
converting the corresponding digital output to an analog current;
compensating an excess delay associated with the means for converting the analog output, and generating an output current as a result of compensating; and
summing the analog current with the analog input current and the output current, wherein converting the corresponding digital output to the analog current is performed by a circuitry that comprises: a p type current source; a first p-type transistor coupled in series with the p-type current source; a first n-type transistor coupled in series with the first p-type transistor; and an n-type current source coupled in series with the first n-type transistor.

* * * * *